(12) United States Patent
Miyano

(10) Patent No.: US 8,164,370 B2
(45) Date of Patent: Apr. 24, 2012

(54) CLOCK CONTROL CIRCUIT AND SEMICONDUCTOR DEVICE INCLUDING THE SAME

(75) Inventor: Kazutaka Miyano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/656,601

(22) Filed: Feb. 4, 2010

(65) Prior Publication Data

US 2010/0201413 A1  Aug. 12, 2010

(30) Foreign Application Priority Data

Feb. 12, 2009 (JP) ................... 2009-030279

(51) Int. Cl.
*H03L 7/06* (2006.01)
(52) U.S. Cl. ........................................ 327/158
(58) Field of Classification Search .................. 327/149
See application file for complete search history.

(56) References Cited

U.S. PATENT DOCUMENTS

| | | | |
|---|---|---|---|
| 7,046,060 B1 * | 5/2006 | Minzoni et al. | 327/158 |
| 7,336,752 B2 * | 2/2008 | Vlasenko et al. | 375/376 |
| 7,592,846 B2 * | 9/2009 | Mehas et al. | 327/158 |
| 7,724,051 B2 * | 5/2010 | Tomar et al. | 327/158 |
| 7,876,138 B2 * | 1/2011 | Kobayashi et al. | 327/158 |
| 2004/0125905 A1 * | 7/2004 | Vlasenko et al. | 375/376 |
| 2008/0042704 A1 * | 2/2008 | Na | 327/158 |
| 2008/0089459 A1 * | 4/2008 | Vlasenko et al. | 375/376 |
| 2008/0218227 A1 * | 9/2008 | Maeda | 327/156 |
| 2009/0146712 A1 * | 6/2009 | Ma et al. | 327/158 |
| 2009/0189658 A1 * | 7/2009 | Tomar et al. | 327/158 |
| 2009/0243677 A1 * | 10/2009 | Becker et al. | 327/158 |
| 2010/0102862 A1 * | 4/2010 | Takahashi et al. | 327/158 |

FOREIGN PATENT DOCUMENTS

JP    2008-217947    9/2008

* cited by examiner

*Primary Examiner* — Lincoln Donovan
*Assistant Examiner* — Khareem E Almo
(74) *Attorney, Agent, or Firm* — McGinn IP Law Group, PLLC

(57) ABSTRACT

A clock control circuit includes a phase determination circuit that generates a first phase determination signal based on a phase of an external clock signal, a counter circuit that updates a count value based on a second phase determination signal for each sampling period, a delay line that generates an internal clock signal by delaying the external clock signal based on the count value, and an invalidation circuit that generates the second phase determination signal which is obtained by invalidating a change of the first phase determination signal within a same sampling period in response to a fact that the first phase determination circuit indicates a predetermined logical level.

20 Claims, 9 Drawing Sheets

CLOCK CONTROL CIRCUIT AND SEMICONDUCTOR DEVICE INCLUDING THE SAME

BACKGROUND OF THE INVENTION

1. Field of the Invention

The present invention relates to a clock control circuit and a semiconductor device including the clock control circuit, and more particularly relates to a clock control circuit that adjusts a phase or a duty cycle of a clock signal, such as a DLL circuit and a duty-cycle compensation circuit, and a semiconductor device that includes the clock control circuit.

2. Description of Related Art

In recent years, a synchronous memory that performs an operation in synchronization with a clock signal has been widely used as a main memory for a personal computer and the like. In particular, in a synchronous memory device of a DDR (Double Data Rate) type among various types of synchronous memory devices, a DLL circuit that generates an internal clock signal synchronized with an external clock signal is an essential component because it is necessary to synchronize input/output data with the external clock signal in a precise manner (see Japanese Patent Application Laid-open No. 2008-217947).

Such a DLL circuit includes a counter circuit that updates its count value based on a phase of the external clock signal and a delay line that generates the internal clock signal by delaying the external clock signal based on the count value of the counter circuit. The update of the count value is performed in a predetermined sampling period. For this reason, when a result of determining the phase is temporarily reversed due to a noise and the like at a timing at which the count value is updated, the count value is updated in a direction opposite to its intended direction. That is, a delay amount of the delay line that should be increased may be decreased, or conversely, a delay amount that should be decreased may be increased.

In some cases, a jitter component is superimposed on the external clock signal. The jitter component is a fluctuation in a clock frequency, and this fluctuation has a predetermined frequency. When the jitter component affects the DLL circuit, in some cases, a loop that repeats an up count and a down count in an alternate manner is formed despite the phase is considerably out of synchronization, from which it cannot escape.

Meanwhile, a period for locking the DLL circuit is defined by the standards. Therefore, if the delay line is adjusted to the opposite direction due to a noise or if the loop is formed due to a jitter component, the DLL circuit cannot be locked within the period defined by the standards.

In this way, in the conventional DLL circuit, there has been a problem that it cannot be properly locked when affected by a noise or a jitter component. This kind of problem also occurs in other types of clock control circuits that control a clock signal, not only the DLL circuit, such as a duty-cycle compensation circuit for compensating a duty cycle of an internal clock signal. That is, even in the duty-cycle compensation circuit, if it is affected by a noise or a jitter component, its internal clock signal may not be adjusted to a desired duty cycle.

SUMMARY

In one embodiment, there is provided a clock control circuit comprising: a phase determination circuit that generates a phase determination signal based on a phase of a first clock signal; a first counter circuit that updates a count value based on the phase determination signal for each sampling period; a first delay line that generates a second clock signal by delaying the first clock signal based on the count value; and a first invalidation circuit that invalidates a change of the phase determination signal within a same sampling period in response to a fact that the phase determination signal indicates a first logical level.

In another embodiment, there is provided a semiconductor device that includes the clock control circuit as claimed in claim 12, the semiconductor device comprising: an output buffer that outputs an external output signal in synchronization with the second clock signal; and a replica buffer that has a substantially same circuit configuration as the output buffer and outputs the third clock signal in synchronization with the second clock signal.

In still another embodiment, there is provided a clock control circuit comprising: a delay line that generates a second clock signal by delaying a first clock signal; a duty-cycle determination circuit that generates a duty-cycle determination signal based on a duty cycle of the second clock signal; a counter circuit that updates a count value indicating a delay amount of the delay line based on the duty-cycle determination signal for each sampling period; and an invalidation circuit that invalidates a change of the duty-cycle determination signal within a same sampling period in response to a fact that the duty-cycle determination signal indicates a predetermined logical level.

As described above, according to the present invention, when a determination signal is changed within a sampling period, the invalidation circuit fixes the determination signal to a predetermined logical level, which makes it possible to exclude a component that affects the determination signal in a short period, such as a noise or a jitter component. Therefore, if the clock control circuit according to the present invention is applied to a DLL circuit, it is possible to prevent a phenomenon that the DLL circuit is kept unlocked for a long period. Furthermore, if the clock control circuit according to the present invention is applied to a duty-cycle compensation circuit, it is possible to prevent a phenomenon that the internal clock signal cannot be adjusted to a desired duty cycle for a long period.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
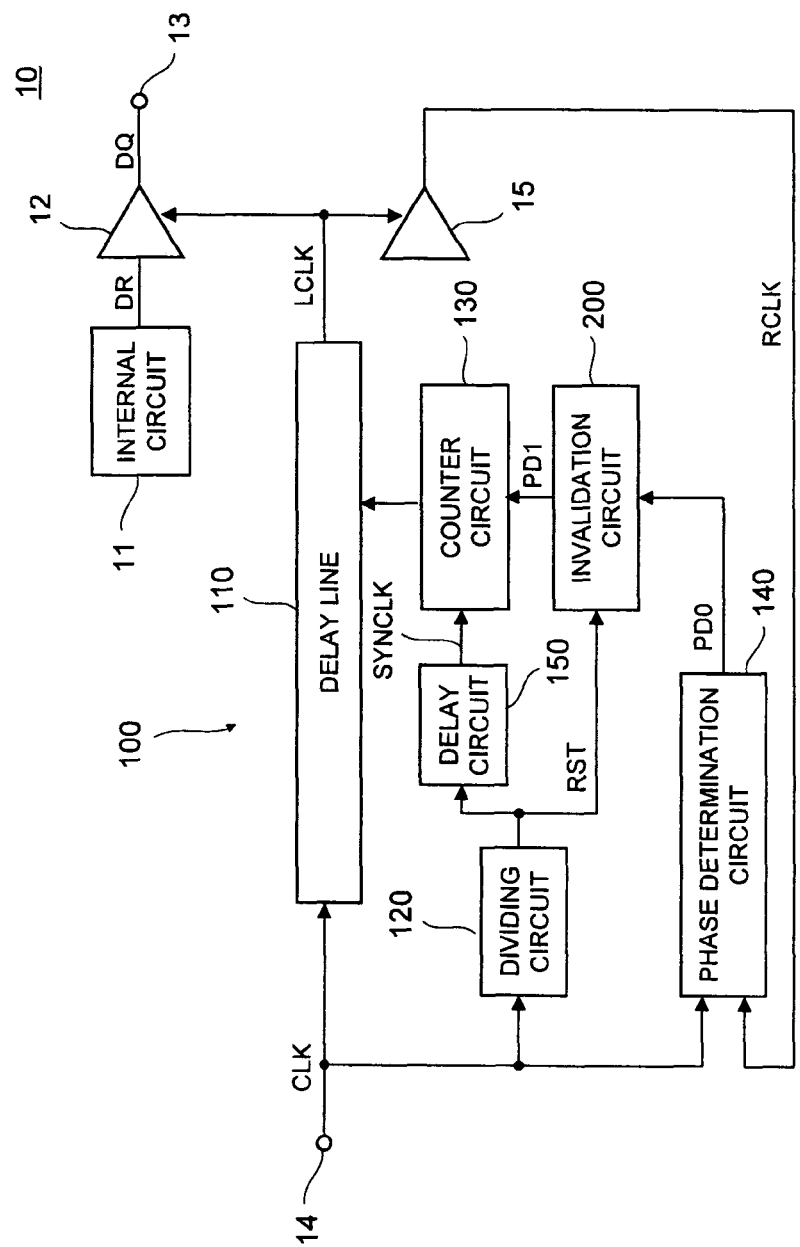
FIG. 1 is a block diagram of a semiconductor device 10 according to a first embodiment of the present invention.

FIG. 1 is a block diagram of a semiconductor device 10 according to a first embodiment of the present invention.

As shown in FIG. 1, the semiconductor device 10 according to the first embodiment includes an internal circuit 11 that outputs an internal output signal DR, an output buffer 12 that outputs an external output signal DQ based on the internal output signal DR, and a DLL circuit 100 that controls an operation timing of the output buffer 12. The internal circuit 11 has a different configuration according to a type of the semiconductor device 10. For example, when the semiconductor device 10 according to the first embodiment is a DRAM, the internal circuit 11 includes components such as a memory cell array, a column switch, and a read amplifier.

The output buffer 12 is a circuit that outputs the external output signal DQ to the outside via an output terminal 13, where an output timing of the external output signal DQ is required to be synchronized with an external clock signal CLK (a first clock signal) that is input via a clock terminal 14. The operation timing of the output buffer 12 is controlled by the DLL circuit 100. The configuration of the DLL circuit 100 is explained in detail below.

As shown in FIG. 1, the DLL circuit 100 includes a delay line 110, a dividing circuit 120, a counter circuit 130, a phase determination circuit 140, and an invalidation circuit 200.

The delay line 110 is a circuit that generates an internal clock signal LCLK (a second clock signal) by delaying the external clock signal CLK. Although not particularly limited, it is preferable that the delay line 110 includes a coarse delay line that delays the external clock signal with a relatively coarse adjustment pitch and a fine delay line that delays the external clock signal with a relatively fine adjustment pitch.

As shown in FIG. 1, the internal clock signal LCLK is supplied to the output buffer 12 and a replica buffer 15. As described above, the output buffer 12 is a circuit that receives the internal output signal DR that is supplied from the internal circuit 11 and supplies it to the output terminal 13 as the external output signal DQ. On the other hand, the replica buffer 15 is a circuit that has a substantially same circuit configuration as the output buffer 12 and outputs a replica clock signal RCLK (a third clock signal) in synchronization with the internal clock signal LCLK. With this configuration, a phase of the replica clock signal RCLK matches with a phase of the external output signal DQ in a precise manner. However, as for a size of a transistor that constitutes the replica buffer 15, it is not necessarily to be the same as a size of a transistor constituting the output buffer 12, which means that, as long as the impedance is substantially the same, a shrunk transistor can be used in the replica buffer 15.

The dividing circuit 120 is a circuit that generates a reset signal RST, which is a one shot pulse, by dividing the external clock signal CLK. The reset signal RST is supplied to the invalidation circuit 200 and a delay circuit 150. The delay circuit 150 is a circuit that generates an update timing signal SYNCLK by delaying the reset signal RST. The update timing signal SYNCLK is supplied to the counter circuit 130, being used as a synchronization signal indicating a timing for updating a count value of the counter circuit 130. Therefore, an activation cycle of the update timing signal SYNCLK is defined as a sampling cycle of the DLL circuit 100. It is preferable that a delay amount of the delay circuit 150 is slightly shorter than a sampling period.

The reason why the dividing circuit 120 is used for generating the reset signal RST is because a certain period of time is required for an update of the counter circuit 130 and a change of the delay amount of the delay line 110, and therefore, it is difficult to perform the update of the counter circuit 130 and the change of the delay amount of the delay line 110 for every cycles of the external clock signal CLK. Besides, if the update of the counter circuit 130 and the change of the delay amount of the delay line 110 are frequently performed beyond necessity, the power consumption is increased in a considerable amount.

The counter circuit 130 is a circuit that sets the delay amount of the delay line 110. The count value of the counter circuit 130 is updated in synchronization with the update timing signal SYNCLK. The up and down of the count value is determined based on a phase determination signal PD1 that is supplied from the invalidation circuit 200. When the phase determination signal PD1 indicates an up count (its logical level is High), the counter circuit 130 up counts its count value in synchronization with the update timing signal SYNCLK, by which the delay amount of the delay line 110 is increased. On the contrary, when the phase determination signal PD1 indicates a down count (its logical level is Low), the counter circuit 130 down counts its count value in synchronization with the update timing signal SYNCLK, by which the delay amount of the delay line 110 is decreased.

The phase determination circuit 140 is a circuit that detects a phase difference between the external clock signal CLK and the replica clock signal RCLK. As described above, the phase of the replica clock signal RCLK is adjusted to match with the phase of the external output signal DQ by the delay line 110. However, the phases of both signals are changed from moment to moment due to a change of a parameter that affects the delay amount of the delay line 110, such as voltage and temperature, a frequency change of the external clock signal CLK itself, and the like. The phase determination circuit 140 detects such a change, and determines whether the replica clock signal RCLK is advanced or lagged with respect to the external clock signal CLK based on the detection of the change. The determination is performed for every cycles of the external clock signal CLK, and a result of the determination is supplied to the invalidation circuit 200 as a phase determination signal PD0.

The invalidation circuit 200 is a circuit that receives the phase determination signal PD0 and the reset signal RST, and based on them, generates the phase determination signal PD1.

Figure 2:
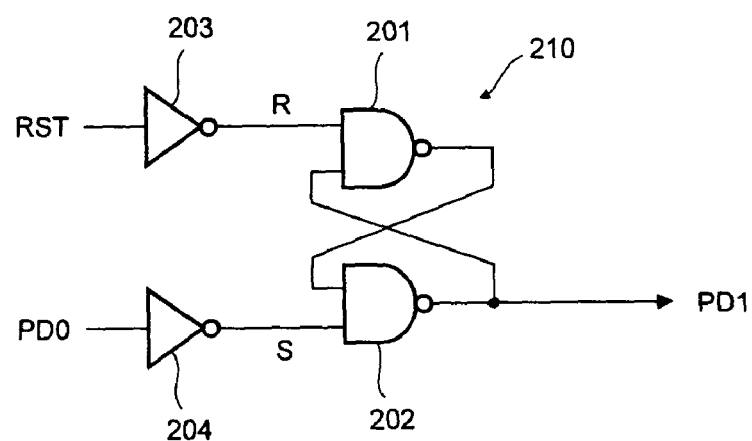
FIG. 2 is a circuit diagram of the invalidation circuit 200.

FIG. 2 is a circuit diagram of the invalidation circuit 200.

As shown in FIG. 2, the invalidation circuit 200 includes an SR latch circuit 210 that is formed with NAND circuits 201 and 202 connected to each other in a cyclic manner, an inverter 203 that inverts the reset signal RST and supplies the inverted signal to a reset input terminal (R) of the SR latch circuit 210, and an inverter 204 that inverts the phase determination signal PD0 and supplies the inverted signal to a set input terminal (S) of the SR latch circuit 210.

With this configuration, when the level of the phase determination signal PD0 becomes High, the SR latch circuit 210 takes a set state regardless of the logical level of the reset signal RST, and the level of the phase determination signal PD1, which is the output of the SR latch circuit 210, becomes High. The case that the level of the phase determination signal PD0 becomes High is when a phase lead of the replica clock signal RCLK ahead of the external clock signal CLK is detected by the phase determination circuit 140. That is, it is a case that an increase of the delay amount of the delay line 110 is required.

On the other hand, when the level of the reset signal RST becomes High and the level of the phase determination signal PD0 becomes Low, the SR latch circuit 210 takes a reset state, and the level of the phase determination signal PD1, which is the output of the SR latch circuit 210, becomes Low. The case that the level of the phase determination signal PD0 becomes Low is when a phase lag of the replica clock signal RCLK behind the external clock signal CLK is detected by the phase determination circuit 140. That is, it is a case that a decrease of the delay amount of the delay line 110 is required.

In this manner, after the SR latch circuit 210 is reset, the SR latch circuit 210 is set when the level of the phase determination signal PD0 becomes High, and after that, even when the level of the phase determination signal PD0 is changed to Low, the effect of the change is invalidated. That is, in a period from when the SR latch circuit 210 is set to when the SR latch circuit 210 is reset, once the level of the phase determination signal PD0 becomes High, the level of the phase determination signal PD1, which is the output of the invalidation circuit 200, is fixed to High. The case that the level of the phase determination signal PD1 becomes Low is limited to a period in which the level of the phase determination signal PD0 is kept Low after the SR latch circuit 210 is reset.

Figure 3:
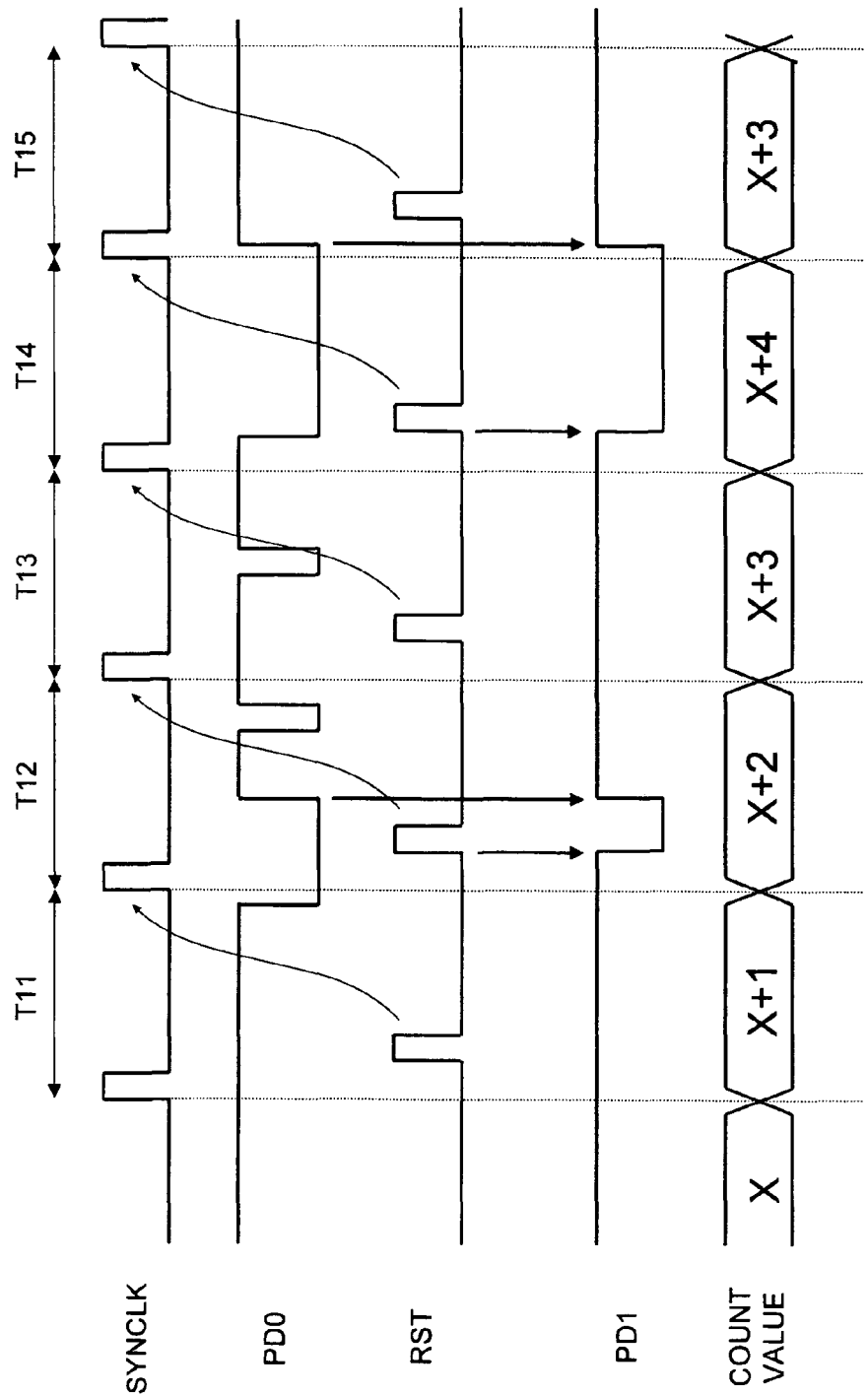
FIG. 3 is a timing chart for explaining an operation of the DLL circuit according to the first embodiment.

FIG. 3 is a timing chart for explaining an operation of the DLL circuit according to the first embodiment.

As shown in FIG. 3, in the present example, the delay amount of the delay circuit 150 is set to be slightly shorter than the sampling period. Therefore, when the update timing signal SYNCLK is activated, the reset signal RST is activated shortly after that. This means that, when the count value of the counter circuit 130 is updated, the reset signal RST is activated shortly after that.

As shown in FIG. 3, at timings at which the reset signal RST is activated in the sampling periods T11, T13, and T15, the SR latch circuit 210 included in the invalidation circuit 200 is not reset because the level of the phase determination signal PD0 is High. In this case, because the set state of the SR latch circuit 210 is maintained, even when the level of the phase determination signal PD0 is changed to Low along the way, as shown in the sampling period T13, such a change is invalidated, and the level of the phase determination signal PD1 is kept High. Consequently, the count value of the counter circuit 130 is forcibly up counted at the next timing at which the update timing signal SYNCLK is activated. That is, the delay amount of the delay line 110 is forcibly increased.

On the other hand, at timings at which the reset signal RST is activated in the sampling periods T12 and T14, the SR latch circuit 210 is reset in synchronization with the reset signal RST because the level of the phase determination signal PD0 is Low. Therefore, the level of the phase determination signal PD1, which is the output of the invalidation circuit 200, is changed to Low.

However, in the sampling period T12, the level of the phase determination signal PD0 is changed later to High, and in response to this change, the SR latch circuit 210 is set again. The level of the phase determination signal PD1 is returned to High, and after that, even when the level of the phase determination signal PD0 is changed to Low in the same sampling period, such a change is invalidated, and the level of the phase determination signal PD1 is kept High. Consequently, the count value of the counter circuit 130 is forcibly up counted at the next timing at which the update timing signal SYNCLK is activated. That is, the delay amount of the delay line 110 is forcibly increased.

On the other hand, in the sampling period T14, the level of the phase determination signal PD0 is kept to Low until the timing at which the next update timing signal SYNCLK is activated, after the SR latch circuit 210 is reset by the activation of the reset signal RST. Therefore, the reset state of the SR latch circuit 210 is maintained, and the count value of the counter circuit 130 is down counted at the next timing at which the update timing signal SYNCLK is activated. That is, the delay amount of the delay line 110 is decreased.

In this manner, in the example of the first embodiment, the count value of the counter circuit 130 is down counted only in the case of the sampling period T14, that is, the case that the level of the phase determination signal PD0 is kept Low until the timing at which the next update timing signal SYNCLK is activated after the SR latch circuit 210 is reset by the activation of the reset signal RST. In other cases, the change of the phase determination signal PD0 is invalidated by the invalidation circuit 200, and the count value of the counter circuit 130 is forcibly up counted.

With this configuration, a component that affects the phase determination signal PD0 in a short period, such as the noise and the jitter component, is excluded, and therefore, it is possible to prevent a phenomenon that the DLL circuit 100 is kept unlocked for a long period.

In the first embodiment, the DLL lock may be performed by continuing the up count even in a case that using a down count takes a shorter time to achieve the DLL lock (a case that a lead amount of the replica clock signal RCLK with respect to the external clock signal CLK is larger than a lag amount), because the up count of the counter circuit 130 has a priority. In this case, although it takes a slightly longer time to achieve the DLL lock, at least the problem of causing a loop in which the up count and the down count are repeated in an alternate manner does not occur, which makes it possible to complete the DLL lock within the period defined by the standards.

A second embodiment of the present invention is explained next.

Figure 4:
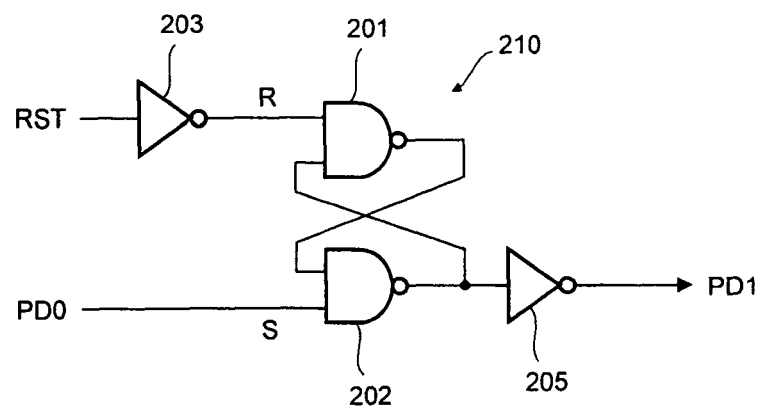
FIG. 4 is a circuit diagram of an invalidation circuit 200a according to the second embodiment.

FIG. 4 is a circuit diagram of an invalidation circuit 200a according to the second embodiment. The second embodiment is different from the first embodiment in that the invalidation circuit 200 shown in FIG. 1 is replaced by the invalidation circuit 200a, and other features are the same. Therefore, redundant explanations will be omitted.

As shown in FIG. 4, the invalidation circuit 200a is different from the invalidation circuit 200 shown in FIG. 2 in that the inverter 204 is removed and an inverter 205 that inverts the output of the SR latch circuit 210 is added. Other features of the invalidation circuit 200a are the same as the invalidation circuit 200 shown in FIG. 2.

With this configuration, when the level of the phase determination signal PD0 becomes Low, the SR latch circuit 210 takes a set state regardless of the logical level of the reset signal RST, and the level of the phase determination signal PD1, which is the output of the SR latch circuit 210, becomes Low. On the other hand, when the levels of the reset signal RST and the phase determination signal PD0 becomes High, the SR latch circuit 210 takes a reset state, and the level of the phase determination signal PD1, which is the output of the SR latch circuit 210, becomes High.

In this manner, after the SR latch circuit 210 is reset, the SR latch circuit 210 is set when the level of the phase determination signal PD0 becomes Low, and after that, even when the level of the phase determination signal PD0 is changed to High, the effect of the change is invalidated. That is, in a period from when the SR latch circuit 210 is set to when the SR latch circuit 210 is reset, once the level of the phase determination signal PD0 becomes Low, the level of the phase determination signal PD1, which is the output of the invalidation circuit 200a, is fixed to Low. The case that the level of the phase determination signal PD1 becomes High is limited to a period in which the level of the phase determination signal PD0 is kept High after the SR latch circuit 210 is reset.

Figure 5:
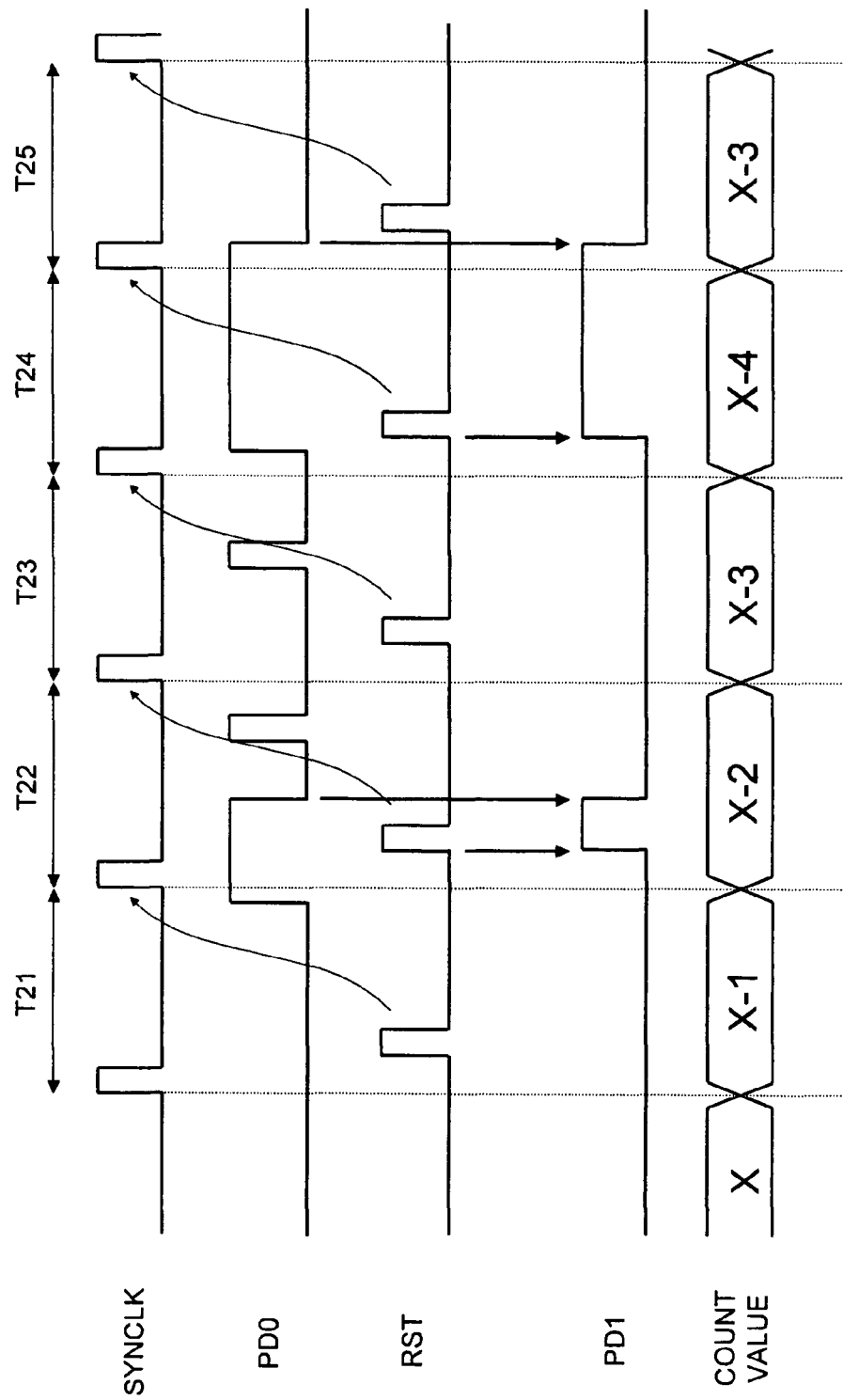
FIG. 5 is a timing chart for explaining an operation of the DLL circuit according to the second embodiment.

FIG. 5 is a timing chart for explaining an operation of a DLL circuit according to the second embodiment.

As shown in FIG. 5, at timings at which the reset signal RST is activated in the sampling periods T21, T23, and T25, the SR latch circuit 210 included in the invalidation circuit 200a is not reset because the level of the phase determination signal PD0 is Low. In this case, because the set state of the SR latch circuit 210 is maintained, even when the level of the phase determination signal PD0 is changed to High along the way, as shown in the sampling period T23, such a change is invalidated, and the level of the phase determination signal PD1 is kept Low. Consequently, the count value of the counter circuit 130 is forcibly down counted at the next timing at which the update timing signal SYNCLK is activated. That is, the delay amount of the delay line 110 is forcibly decreased.

On the other hand, at timings at which the reset signal RST is activated in the sampling periods T22 and T24, the SR latch circuit 210 is reset in synchronization with the reset signal RST because the level of the phase determination signal PD0 is High. Therefore, the level of the phase determination signal PD1, which is the output of the invalidation circuit 200a, is changed to High.

However, in the sampling period T22, the level of the phase determination signal PD0 is changed later to Low, and in response to this change, the SR latch circuit 210 is set again. The level of the phase determination signal PD1 is returned to Low, and after that, even when the level of the phase determination signal PD0 is changed to High in the same sampling period, such a change is invalidated, and the level of the phase determination signal PD1 is kept Low. Consequently, the count value of the counter circuit 130 is forcibly down counted at the next timing at which the update timing signal SYNCLK is activated. That is, the delay amount of the delay line 110 is forcibly decreased.

On the other hand, in the sampling period T24, the level of the phase determination signal PD0 is kept to High until the timing at which the next update timing signal SYNCLK is activated, after the SR latch circuit 210 is reset by the activation of the reset signal RST. Therefore, the reset state of the SR latch circuit 210 is maintained, and the count value of the counter circuit 130 is up counted at the next timing at which the update timing signal SYNCLK is activated. That is, the delay amount of the delay line 110 is increased.

In this manner, in the example of the second embodiment, the count value of the counter circuit 130 is up counted only in the case of the sampling period T24, that is, the case that the level of the phase determination signal PD0 is kept High until the timing at which the next update timing signal SYNCLK is activated after the SR latch circuit 210 is reset by the activation of the reset signal RST. In other cases, the change of the phase determination signal PD0 is invalidated by the invalidation circuit 200a, and the count value of the counter circuit 130 is forcibly down counted.

Accordingly, the second embodiment can achieve the same effects as those of the first embodiment.

Note that, in the second embodiment, the DLL lock may be performed by continuing the down count even in a case that using an up count takes a shorter time to achieve the DLL lock (a case that a lag amount of the replica clock signal RCLK with respect to the external clock signal CLK is larger than a lead amount), because the down count of the counter circuit 130 has a priority. In this case, although it takes a slightly longer time to achieve the DLL lock, at least the problem of causing a loop in which the up count and the down count are repeated in an alternate manner does not occur, which makes it possible to complete the DLL lock within the period defined by the standards.

A third embodiment of the present invention of the present invention is explained next.

Figure 6:
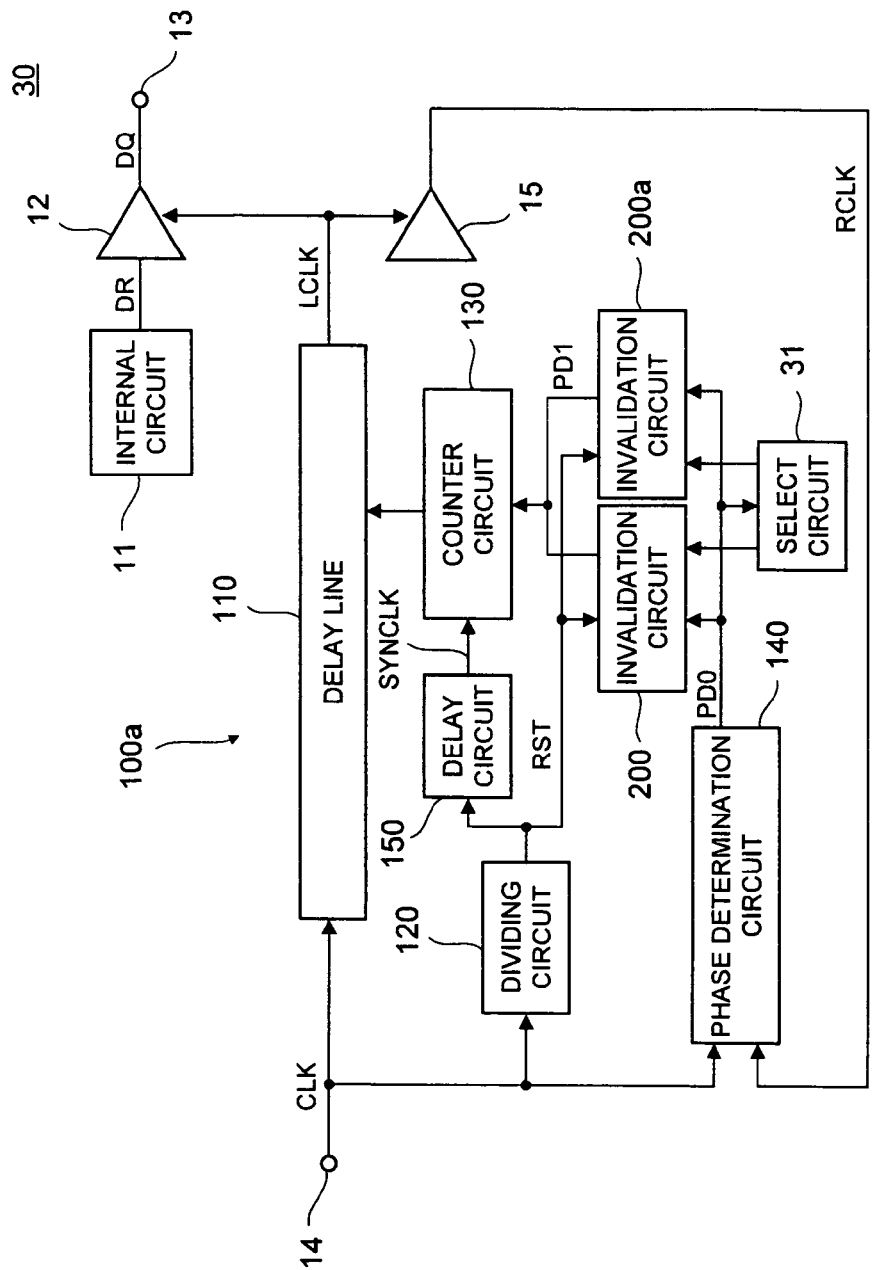
FIG. 6 is a block diagram of a semiconductor device 30 according to a third embodiment of the present invention.

FIG. 6 is a block diagram of a semiconductor device 30 according to the third embodiment. The third embodiment is different from the first embodiment in that a DLL circuit 100a includes both the invalidation circuits 200 and 200a and a select circuit 31 that selects either one of the invalidation circuits 200 and 200a. Because other features of the semiconductor device 30 are the same as those of the semiconductor device 10 according to the first embodiment, like reference numerals are denoted to like constituent elements and explanations thereof will be omitted.

As shown in FIG. 6, the phase determination signal PD0, which is the output of the phase determination circuit 140, is input to the select circuit 31, and after the DLL circuit 100a starts an operation, the select circuit 31 selects either one of the invalidation circuits 200 and 200a based on the logical level of the phase determination signal PD0 that is firstly obtained. The output of the other invalidation circuit that is unselected is ignored. When the level of the phase determination signal PD0 that is firstly obtained is High, the select circuit 31 selects the invalidation circuit 200 that gives a priority to the up count, and when the level of the phase determination signal PD0 that is firstly obtained is Low, the select circuit 31 selects the invalidation circuit 200a that gives a priority to the down count.

When the level of the phase determination signal PD0 that is firstly obtained is High, it means that it is probably a case that using an up count takes a shorter time to achieve the DLL lock (a case that a lag amount of the replica clock signal RCLK with respect to the external clock signal CLK is larger than a lead amount). On the contrary, when the level of the phase determination signal PD0 that is firstly obtained is Low, it means that it is probably a case that using a down count takes a shorter time to achieve the DLL lock (a case that a lead amount of the replica clock signal RCLK with respect to the external clock signal CLK is larger than a lag amount). Therefore, by selecting either one of the invalidation circuits 200 and 200a based on the phase determination signal PD0 that is firstly obtained, it is possible to lock the DLL circuit 100a faster than the first and second embodiments.

A fourth embodiment of the present invention of the present invention is explained next.

Figure 7:
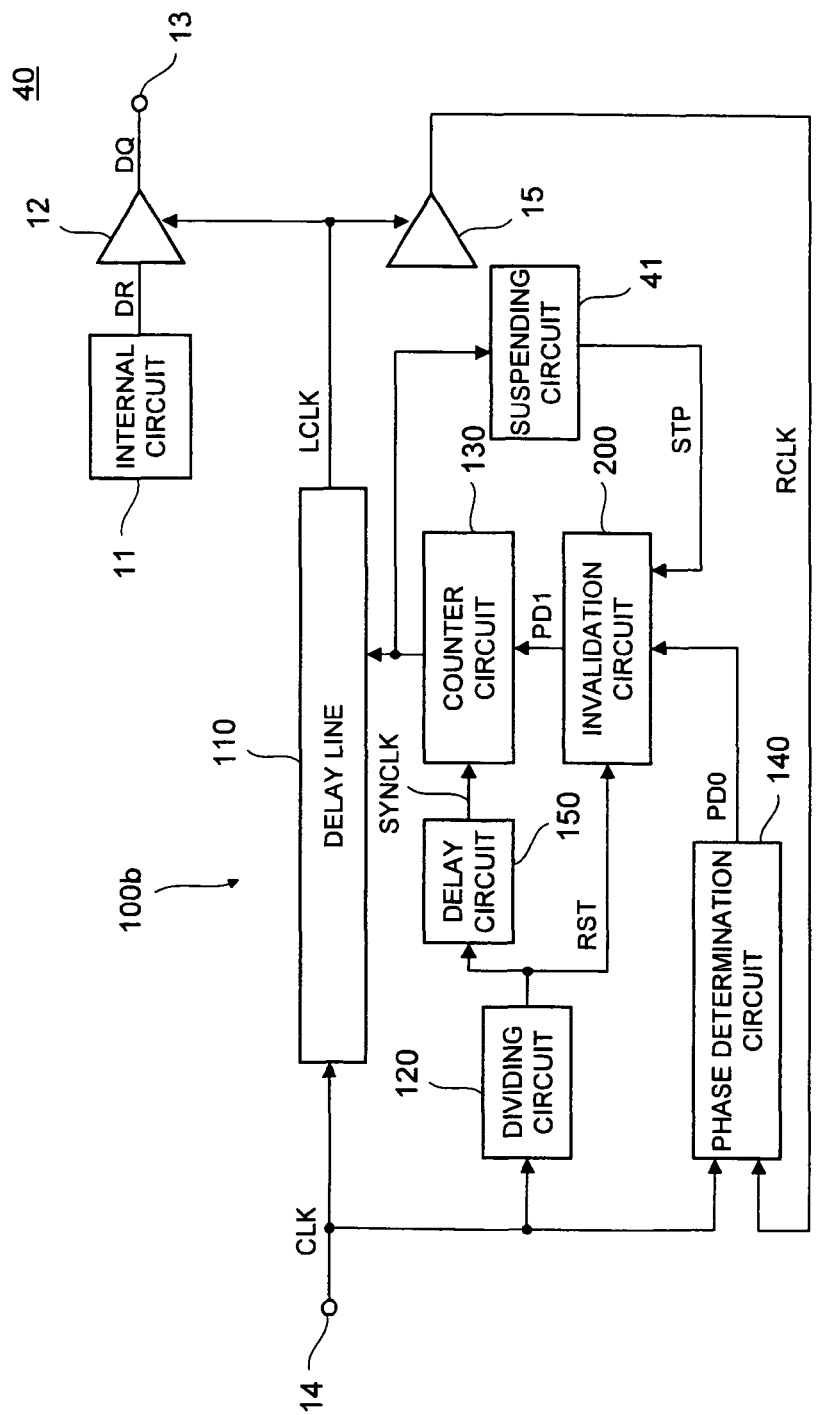
FIG. 7 is a block diagram of a semiconductor device 40 according to a fourth embodiment of the present invention.

FIG. 7 is a block diagram of a semiconductor device 40 according to the fourth embodiment of the present invention. The fourth embodiment is different from the first embodiment in that a DLL circuit 100b includes a suspending circuit 41 that suspends the invalidating operation of the invalidation circuit 200. Because other features of the semiconductor device 40 are the same as those of the semiconductor device 10 according to the first embodiment, like reference numerals are denoted to like constituent elements and explanations thereof will be omitted.

A suspend signal STP, which is the output of the suspending circuit 41, is deactivated in its initial state, and therefore, the invalidation circuit 200 performs the invalidating operation as described above. Meanwhile, the count value of the counter circuit 130 is supplied to the suspending circuit 41, and when the count value is changed with a predetermined pattern, the suspend signal STP is activated. When the suspend signal STP is activated, the invalidating operation of the invalidation circuit 200 is suspended, and the phase determination signal PD0 is supplied as it is to the counter circuit 130 as the phase determination signal PD1.

The predetermined pattern is a pattern of the count value that appears in or near a state that the DLL circuit 100b is locked. Specifically, it is preferable to activate the suspend signal STP when a pattern in which the count value of the counter circuit 130 is up counted and then down counted or an opposite pattern appears. It is because that such a pattern appears when the phases of the external clock signal CLK and the replica clock signal RCLK are almost matched with each other. In this case, when the up count is given a priority by the invalidation circuit 200, there is a possibility that the phases are shifted from the matching condition. Therefore, in the present embodiment, the operation of the invalidation circuit 200 is suspended by the suspending circuit 41 in such cases.

Accordingly, the fourth embodiment can achieve an effect of more securely maintaining a locked state after the DLL lock, as well as the effects of the first embodiment.

As for the change pattern of the count value for activating the suspend signal STP, in addition to the above described pattern, a pattern can be used in which the up count and the down count are repeated three times or four times in an alternate manner. The feature that the up count and the down count are repeated in an alternate manner is a clearer evidence that the phases of the external clock signal CLK and the replica clock signal RCLK are almost matched with each other.

A fifth embodiment of the present invention is explained next.

Figure 8:
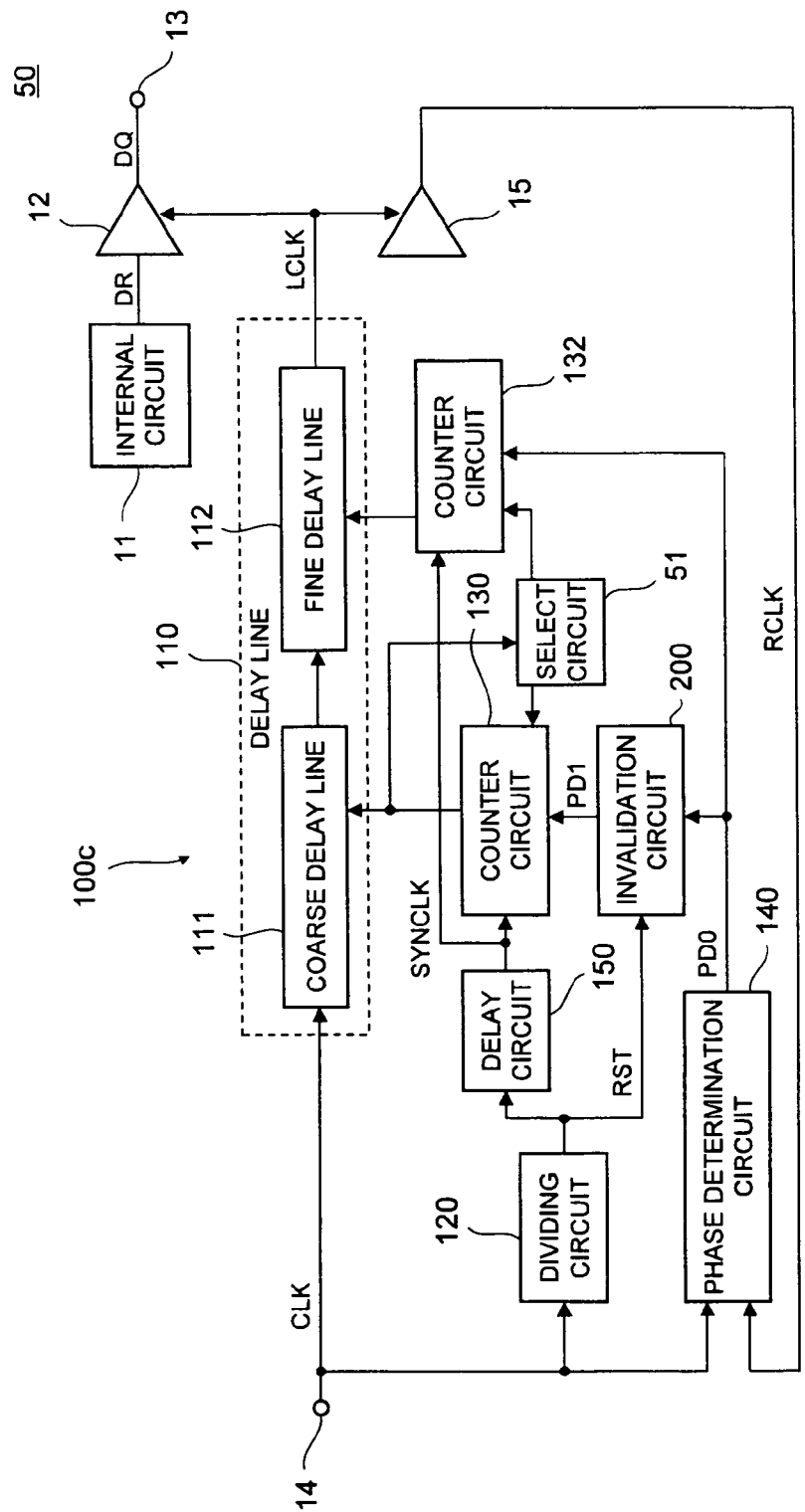
FIG. 8 is a block diagram of a semiconductor device 50 according to a fifth embodiment of the present invention.

FIG. 8 is a block diagram of a semiconductor device 50 according to the fifth embodiment. The fifth embodiment is different from the first embodiment in that a DLL circuit 100c includes the delay line 110 including a coarse delay line 111 and a fine delay line 112, a counter circuit 132 for adjusting the delay amount of the fine delay line 112, and a select circuit 51 that selects either one of the counter circuit 130 and the counter circuit 132. Because other features of the semiconductor device 50 are the same as those of the semiconductor device 10 according to the first embodiment, like reference numerals are denoted to like constituent elements and explanations thereof will be omitted.

The coarse delay line 111 is a delay line having a relatively coarse adjustment pitch for the delay amount, and is configured with an inverter chain in which inverters having relatively large delay amounts are connected in a cascaded manner. The fine delay line 112 is a delay line having a relatively fine adjustment pitch for the delay amount, and is configured with an inverter chain in which inverters having relatively small delay amounts are connected in a cascaded manner or an interpolator which combines two clocks obtained with the coarse delay line 111.

In the fifth embodiment, the delay amount of the coarse delay line 111 is adjusted by the count value of the counter circuit 130, and the delay amount of the fine delay line 112 is adjusted by the count value of the counter circuit 132. The coarse delay line 111 and the fine delay line 112 are connected in series, so that, after the delay amount is roughly adjusted by the coarse delay line 111, the fine adjustment of the delay amount is performed by the fine delay line 112, to realize the DLL lock in a faster and more precise manner.

As shown in FIG. 8, while the phase determination signal PD1 is supplied via the invalidation circuit 200 to the counter circuit 130 that controls the coarse delay line 111, the phase determination signal PD0 is directly supplied to the counter circuit 132 that controls the fine delay line 112. It is because that the fine delay line 112 is mainly used for the fine adjustment of the delay amount after the DLL lock is achieved, so that it does not have much influence during the time from an unlocked state until a locked state that the DLL circuit 100c is locked. Rather, when the invalidating operation is performed on the fine delay line 112, the possibility of the phase shift is increased.

The select circuit 51 is a circuit that allows an operation (a change of the count value) of either one of the counter circuits 130 and 132. In the initial state, the select circuit 51 selects the counter circuit 130, by which the delay line 110 performs a coarse adjustment operation by the coarse delay line 111. The count value of the counter circuit 130 is supplied to the select circuit 51, and when the count value is changed with a predetermined pattern, the select circuit 51 suspends the operation of the counter circuit 130, and instead, selects the counter circuit 132 to perform a fine adjustment operation by the fine delay line 112. As for the predetermined pattern, the same pattern as the pattern for activating the suspend signal STP described above can be used.

In this manner, according to the fifth embodiment, a high speed DLL lock can be obtained, and at the same time, a DLL lock state can be secured in a highly precise manner because the operation of the invalidation circuit 200 does not affect the fine delay line 112.

A sixth embodiment of the present invention is explained next.

Figure 9:
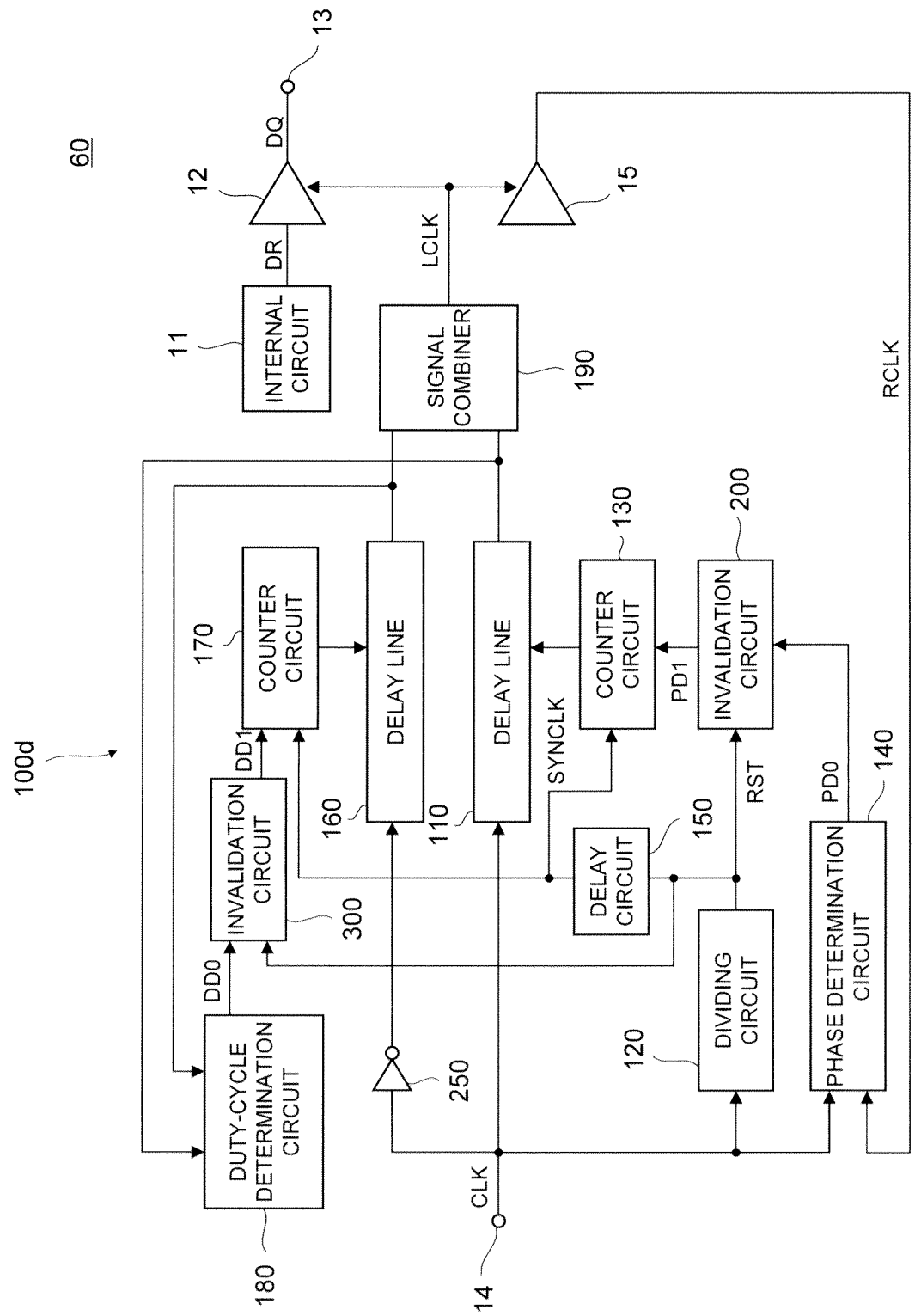
FIG. 9 is a block diagram of a semiconductor device 60 according to a sixth embodiment of the present invention.

FIG. 9 is a block diagram of a semiconductor device 60 according to the sixth embodiment.

As shown in FIG. 9, the semiconductor device 60 according to the sixth embodiment includes a DLL circuit 100d that further includes a delay line 160, a counter circuit 170, a duty-cycle determination circuit 180, and an invalidation circuit 300, and generates the internal clock signal LCLK by combining outputs of the delay lines 110 and 160 by a signal combiner 190. Because other features of the semiconductor device 60 are the same as those of the semiconductor device 10 according to the first embodiment, like reference numerals are denoted to like constituent elements and explanations thereof will be omitted.

The delay line 160 and the counter circuit 170 form a duty-cycle compensation circuit that compensates a duty cycle of an inverted output clock signal CLK that is inverted by an inverter 250. Specifically, the delay line 160 adjusts the duty cycle of the internal clock signal LCLK by adjusting a position of a falling edge of the output clock signal CLK. The adjustment amount is determined by the counter circuit 170. On the other hand, the delay line 110 adjusts the phase of the internal clock signal LCLK by adjusting a position of a rising edge of the output clock signal CLK. With this configuration, the internal clock signal LCLK generated by the signal combiner 190 becomes a signal with the phase and the duty cycle adjusted properly.

The counter circuit 170 is a circuit that sets the delay amount of the delay line 160, and its count value is updated in synchronization with the update timing signal SYNCLK. The increase and decrease of the count value is determined based on a duty-cycle determination signal DD1 that is supplied from the invalidation circuit 300. When the duty-cycle determination signal DD1 indicates an up count, the counter circuit 170 up counts the count value in synchronization with the update timing signal SYNCLK, by which increasing the delay amount of the delay line 160. On the contrary, when the duty-cycle determination signal DD1 indicates a down count, the counter circuit 170 down counts the count value in synchronization with the update timing signal SYNCLK, by which decreasing the delay amount of the delay line 160.

The invalidation circuit 300 is a circuit that receives a duty-cycle determination signal DD0 and the reset signal RST, and based on them, generates the duty-cycle determination signal DD1. The circuit configuration of the invalidation circuit 300 is the same as that of the Invalidation circuit 200 shown in FIG. 2 or the invalidation circuit 200a shown in FIG. 4. Therefore, the invalidation circuit 300 performs the same invalidating operation as the invalidation circuit 200 or 200a does.

The duty-cycle determination circuit 180 is a circuit that detects the duty cycle of the internal clock signal LCLK based on the outputs of the delay lines 110 and 160, and generates the duty-cycle determination signal DD0 based on the detected duty cycle.

In this manner, the DLL circuit 100d according to the sixth embodiment excludes a component that affects the phase determination signal PD0 in a short period by the invalidation circuit 200, and excludes a component that affects the duty-cycle determination signal DD0 in a short period, such as the noise and the jitter component. Therefore, it is possible to quickly adjust not only the phase but also the duty cycle.

It is apparent that the present invention is not limited to the above embodiments, but may be modified and changed without departing from the scope and spirit of the invention.

For example, although a case of applying the present invention to a DLL circuit is explained as an example in the above embodiments, the application target of the present invention is not limited to the DLL circuit. The present invention can also be applied to other types of clock control circuits, such as a duty-cycle compensation circuit (see FIG. 9).

Furthermore, although the invalidation circuit 200 and the like are reset by the reset signal RST in the above embodiments, the update timing signal SYNCLK can be alternatively used as the reset signal RST as long as it does not interfere with an update operation of the counter circuit 130. Moreover, the reset signal RST can also be generated by delaying the update timing signal SYNCLK.

What is claimed is:

1. A semiconductor device, comprising:
 a phase determination circuit that generates a phase determination signal based on a phase of a first clock signal;
 a first counter circuit that updates a count value in each sampling period based on the phase determination signal, a cycle of updating the count value by the first counter circuit being greater than a cycle of the first clock signal, the updating of the count value including an increment of the count value based on one of first and second logic levels of the phase determination signal and a decrement of the count value based on the other of the first and second logic levels of the phase determination signal;
 a first delay line that generates a second clock signal by delaying the first clock signal based on the count value; and
 a first invalidation circuit that invalidates a change of the phase determination signal within a same sampling period in response to a fact that the phase determination signal indicates a first logical level.

2. The semiconductor device as claimed in claim 1, wherein the first invalidation circuit includes an SR latch circuit that is reset in synchronization with a reset signal that is activated in each of the sampling period and set by the first logical level of the phase determination signal,
 thereby the first invalidation circuit invalidates a change of the phase determination signal to a second logical level in a period from the SR latch circuit being set to the SR latch circuit being reset.

3. The semiconductor device as claimed in claim 2, wherein
 the SR latch circuit is reset if the phase determination signal indicates the second logical level when the reset signal is activated, and
 the count value of the first counter circuit is updated in a direction indicated by the second logical level of the phase determination signal when the phase determination signal maintains the second logical level within a same sampling period after the SR latch circuit is reset.

4. The semiconductor device as claimed in claim 1, further comprising a suspending circuit that suspends an invalidating operation of the first invalidation circuit so that the phase determination signal is supplied to the first counter circuit without change.

5. The semiconductor device as claimed in claim 4, wherein the suspending circuit suspends the invalidating operation of the first invalidation circuit in response to a change of a count value of the first counter circuit with a predetermined pattern.

6. The semiconductor device as claimed in claim 5, wherein the predetermined pattern includes at least a pattern in which the count value is up counted and then down counted or another pattern that is opposite to the pattern.

7. The semiconductor device as claimed in claim 1, wherein
 the first delay line includes a coarse delay line having a relatively coarse adjustment pitch for a delay amount and a fine delay line having a relatively fine adjustment pitch for the delay amount, and
 the first counter circuit adjusts the delay amount of the coarse delay line included in the first delay line.

8. The semiconductor device as claimed in claim 7, further comprising:
 a second counter circuit that adjusts the delay amount of the fine delay line included in the first delay line; and
 a first select circuit that allows an operation of either one of the first counter circuit and the second counter circuit.

9. The semiconductor device as claimed in claim 1, further comprising:
 a second invalidation circuit that invalidates a change of the phase determination signal within a same sampling period in response to a fact that the phase determination signal indicates a second logical level; and
 a second select circuit that allows an operation of either one of the first invalidation circuit and the second invalidation circuit.

10. The semiconductor device as claimed in claim 9, wherein the second select circuit allows the operation of either one of the first invalidation circuit and the second invalidation circuit based on the phase determination signal.

11. The semiconductor device as claimed in claim 1, further comprising:
 a duty-cycle determination circuit that generates a duty-cycle determination signal based on a duty cycle of the second clock signal;
 a duty-cycle compensation circuit that compensates the duty cycle of the second clock signal based on the duty-cycle determination signal; and
 a third invalidating circuit that invalidates a change of the duty-cycle determination signal within a same sampling period in response to a fact that the duty-cycle determination signal indicates a predetermined logical level.

12. The semiconductor device as claimed in claim 1, wherein the phase determination circuit determines a phase of the first clock signal by comparing a third clock signal that is obtained by delaying the second clock signal with the first clock signal.

13. A semiconductor device comprising:

a delay line that generates a second clock signal by delaying a first clock signal;

a duty-cycle determination circuit that generates a duty-cycle determination signal based on a duty cycle of the second clock signal;

a counter circuit that updates a count value indicating a delay amount of the delay line based on the duty-cycle determination signal for each sampling period; and an invalidation circuit that invalidates a change of the duty-cycle determination signal within a same sampling period in response to a fact that the duty-cycle determination signal indicates a predetermined logical level.

14. A semiconductor device, comprising:

a phase determination circuit that generates a first phase determination signal in response to a difference in phase between a first clock signal and a second clock signal, the first phase determination signal changing between first and second logic levels;

a counter circuit that receives a second phase determination signal and cyclically performs a sampling operation on the second phase determination signal to increase a count value thereof when the second phase determination signal is sampled to be in a first state and decrease the count value when the second phase determination signal is sampled to be in a second state, a cycle of performing the sampling operation being greater than a cycle of the first clock signal;

a delay line that generates an intermediate clock signal by delaying the first clock signal in response to the count value of the counter circuit;

a buffer circuit that generates the second clock signal in response to the intermediate clock signal; and an invalidation circuit that intervenes between the phase determination circuit and the counter circuit and produces the second phase determination signal in response to the first phase determination signal such that the second phase determination signal is changed between the first and second states a first number of times in response to the first phase determination signal being changed between the first and second logic levels a second number of times within an interval of adjacent sampling operations performed by the counter circuit, the first number of times being smaller than the second number of times and including zero.

15. The device as claimed in claim 14, wherein the counter circuit further receives an update timing signal and the invalidation circuit receives a reset signal, the update timing signal defining the cycle of performing the sampling operation, and the reset signal being substantially equal in cycle to the update timing signal and deviating in phase from the update timing signal.

16. The device as claimed in claim 15, wherein the invalidation circuit comprises an SR flip-flop that is brought into a set state in response to one of the first and second logic levels of the first phase determination signal and into a reset state in response to the reset signal appearing during the other of the first and second logic levels of the first phase determination signal, the SR flip-flop producing the second phase determination signal.

17. The device as claimed in claim 16, wherein the SR flip-flop includes a set node, a reset node and an output node, a first inverter coupled to supply the first phase determination signal to the set node, and a second inverter coupled to supply the reset signal to the reset node, the second phase determination signal being derived from the output node.

18. The device as claimed in claim 16, wherein the SR flip-flop includes a set node supplied with the first phase determination signal, a reset node and an output node, a first inverter coupled to supply the reset signal to the reset node, and a second inverter coupled to the output node to produce the second phase determination signal.

19. The device as claimed in claim 14, further comprising an additional buffer circuit that operates in response to the intermediate clock signal, the additional buffer circuit being configured to be substantially identical to the buffer circuit.

20. The device as claimed in claim 15, further comprising a frequency dividing circuit that frequency-divides the first clock signal to produce the reset signal, and a delay circuit that is coupled to the frequency dividing circuit to produce the update timing signal.

* * * * *